United States Patent [19]

Rodriguez et al.

[11] Patent Number: 5,196,098
[45] Date of Patent: Mar. 23, 1993

[54] APPARATUS AND PROCESS FOR ELECTROPHORETIC DEPOSITION

[75] Inventors: Stephen S. Rodriguez, San Jose, Calif.; Martin J. Harris, Leominster, Mass.; Wayne T. Smith, Philadelphia, Pa.

[73] Assignee: Shipley Company Inc., Newton, Mass.

[21] Appl. No.: 140,632

[22] Filed: Jan. 4, 1988

[51] Int. Cl.$^5$ .............................................. C25D 13/00
[52] U.S. Cl. .......................... 204/180.2; 204/299 EC
[58] Field of Search .............. 204/180.2, 180.3, 180.4, 204/180.5, 180.6, 180.7, 180.8, 180.9, 181.1, 181.2, 181.3, 181.4, 181.5, 181.6, 181.7, 300 EC, 299 EC, 280

[56] References Cited

U.S. PATENT DOCUMENTS

| | | |
|---|---|---|
| 2,898,279 | 8/1959 | Metcalfe et al. ................ 204/181.4 |
| 3,304,250 | 2/1967 | Gilchrist ......................... 204/180.8 |
| 3,320,162 | 1/1966 | Gilchrist ............................... 252/33 |
| 3,761,371 | 9/1973 | Dickie .............................. 204/181.4 |
| 4,162,955 | 7/1979 | Schregenberger ........... 204/299 EC |
| 4,592,816 | 6/1986 | Emmons et al. ................ 204/180.6 |

OTHER PUBLICATIONS

Mohler, "Electrolytic Current Patterns", *Metal Finishing*, Mar. 1985.

*Primary Examiner*—John Niebling
*Assistant Examiner*—John S. Starsiak, Jr.
*Attorney, Agent, or Firm*—Robert L. Goldberg

[57] ABSTRACT

A method and apparatus for electrodeposition of insulating coatings such as photoresists having uniform thickness throughout the coating. The apparatus comprises one or more cathodes disposed in a bath containing an electrophoretic depositing composition, one or more anodes disposed in said bath in face to face relationship with the cathode, and means for applying a voltage between the anode and the cathode to produce a current whereby a current density gradient is formed on the cathode, the gradient comprising high and low current density areas. The anode of the present invention is configured so that the anode is concentrated opposite the high current density areas of the cathode, thereby controlling the thickness of deposition by controlling the amount of current flowing to the cathode.

14 Claims, 2 Drawing Sheets

APPARATUS AND PROCESS FOR ELECTROPHORETIC DEPOSITION

FIELD OF THE INVENTION

This invention relates to apparatus for electrodepositing an insulating composition on a substrate and to methods of using such apparatus. The apparatus and methods are useful in the fabrication of printed circuit boards and other fields where it is desired to coat a conductive substrate with an insulating composition.

BACKGROUND OF THE INVENTION

Electrophoretic deposition involves a process of electrophoresis which is the motion of charged particles through a liquid medium under the influence of an applied electrical field. In some electrodeposition processes, the article to be coated is placed in an electrodeposition bath and made either the anode or the cathode, and a voltage is then applied between the anode and the cathode to produce an electric current and an electrodeposited coating.

Electrodeposition is a standard process for painting cars as well as appliances, machinery and a host of other articles. See, for example, *Handbook of Electropainting Technology*, Electrochemical Publications Ltd., 1978.

The art teaches that the current in a working electrolytic bath passes from the anode to the cathode. From some locations on the anode, the current passes straight to the cathode. From other locations, the current starts out almost in the opposite direction and takes a long curved arc in reaching the cathode. This results in high and low current density areas generated on the cathode with concomitant differences in coating thickness. The distribution of current in a plating bath can be calculated using techniques known to those skilled in the art and the resulting differences in thickness of deposition in the high current density areas compensated for by moving the electrodes in the bath or by shielding the electrodes in some manner. As used herein "high current density area" means those areas on a cathode where distribution of current is high as may be theoretically determined by one skilled in the art. See, for example, Mohler, J. B., *Metal Finishing*, March 1985, pp. 51-54.

In many electrodeposition processes, the typical deposition pattern shows thicker coatings on the edges of substrates, i.e., the high current density areas, and thinner coating towards the center, i.e., the low current density areas. See, e.g., Mohler, supra. The art also teaches that, for example, to control excessive deposition at the edges (i.e., high current density areas), the high current density areas should be shielded from the anode. See, for example, U.S. Pat. No. 4,162,955, directed to the electrodeposition coating of a continuous sheet of metal as it travels in a horizontal pathway between a pair of electrically charged electrodes. The patent discloses that excessive buildup of coating material at the longitudinal marginal edges of a traveling metal sheet, compared to the thickness of the coating material intermediate to the marginal edges, may be controlled by suspending a plurality of edge guards between the marginal edges of the metal sheet and adjacent electrodes so that the edge guards at least partially cover the marginal edges. The use of the edge guards produces a more uniform coating laterally across the traveling metal sheet. The edge guards are composed of any suitable electrically nonconductive material, such as a plastic. It should be noted that buildup opposite the high current density areas has typically been reported for electrodeposition of materials that remain conductive after plating.

The art also teaches that electrodeposition of compositions that do not remain conductive after electrodeposition, in other words, which become insulating, typically produce a uniform coating. Such deposits have a high electrical resistance, and at a given voltage, deposition is self-terminated for all practical purposes when the resistance of the deposited material reduces the current flow to insignificantly low value. It has been reported that the resistance of the insulator serves to provide leveling in that the area of greatest electrical attraction is coated first and the area of greatest current flows moves to more remote and electrically shielded areas as the resistance builds up on the earlier coated areas. See, e.g., U.S. Pat. Nos. 3,230,162 and 3,761,371.

Electrodeposition of photosensitive coatings is also generally known. See, for example, U.S. Pat. Nos. 3,738,835; 3,954,587; 4,029,561; 4,035,273 and 4,035,274. Furthermore, electrodeposition of photosensitive polymer compositions is disclosed in U.S. Pat. Nos. 4,414,311 and 4,592,816.

U.S. Pat. No. 4,592,816, hereby incorporated by reference, discloses photosensitive polymer compositions capable of being electrophoretically deposited on a conductive surface to form photoresists. Photoresists are photosensitive films capable of transferring an image onto a conductive substrate such as the metal surface of printed circuit boards. Such photoresists are useful in the preparation of printed circuit boards, lithographic printing plates, cathode ray tubes, as well as in chemical milling, solder resist, and planarizing layer applications.

In the fabrication of electrical components using photoresists, a planar or level photoresist coating is critical. Control of deposit thickness is important because the resulting thickness directly affects photospeed, development time, and yield per square foot. Thus, improved apparatus and methods for uniformly electrodepositing photoresist compositions are being sought.

SUMMARY OF THE INVENTION

The subject invention provides an apparatus and process for depositing a planar coating of an insulating material over a conductive substrate by electrophoresis. The apparatus comprises one or more cathodes disposed in a bath containing an electrophoretic depositing composition, one or more anodes disposed in said bath in face to face relationship with the cathode, and means for applying a voltage between the anode and the cathode to produce a current whereby a current density gradient is formed on the cathode, the gradient comprising high and low current density areas. The anode is configured or shaped so that it is concentrated opposite the high current density areas of the cathode, thereby controlling the thickness of deposition by controlling the amount of current flowing to the cathode.

DETAILED DESCRIPTION OF THE INVENTION

Figure 1:
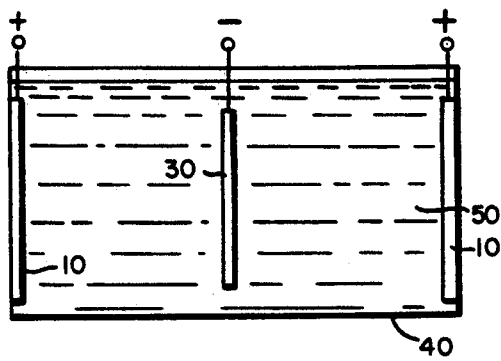
FIG. 1 comprises an electrophoretic apparatus having parallel, vertical electrodes.

The invention described below includes apparatus and processes useful for the electrodeposition of materials which become insulating upon deposition. Such apparatus and processes are particularly useful for the deposition of photoresist materials in the formation of printed circuit boards, although the process is not limited to photoresist deposition or printed circuit board fabrication. Accordingly, portions of the description which follow emphasize deposition of photoresist materials. However, other uses for the apparatus and processes will be apparent to those skilled in the art.

In the fabrication of electronic elements using photoresist coatings, the evenness and thickness of the photoresist coating must be controlled within close tolerances including uniform coating thickness over the surface to be coated. Electrodeposition of photoresists offers advantages in terms of time and quantity of photoresist required compared to photoresist coatings formed from conventional liquid-type and dry film resists. Furthermore, electrophoretic deposition of photoresist results in filling deep recesses such as a scratch in the surface to be coated e.g., copper clad laminate.

In depositing photosensitive polymer compositions, e.g., as disclosed in U.S. Pat. No. 4,592,816, which become insulating upon deposition using apparatus and methods taught in the art, it was surprisingly discovered that the deposits obtained were thicker at the edges and thinner towards the center. Insulating compositions as used hereinafter shall mean compositions which upon electrodeposition become insulating and, as a result, the electrodeposition is self-terminating. This phenomenon became even more apparent as the anode to cathode distance is decreased to obtain the advantages of a more compact cell design and reduced amounts of chemicals to fill the deposition cell. Based on what is taught in the art with respect to the deposition of insulating materials, it was expected that an essentially uniform deposit would be obtained when electrodepositing such insulating compositions.

As has been described above, in electrodeposition processes where the typical thickness variation seen affords thicker coating on the edges of substrates, i.e., the high current density areas, and thinner coating towards the center, the prior art teaches that to control the thickness gradient and obtain an even deposit, the anode must be concentrated toward the low current density areas of the cathode. Concentration of the anode toward the low current density areas of the cathode may be accomplished by appropriately configuring the electrodes, providing means to shield the anode from the cathode, placement of the electrodes in bath and other techniques which will be apparent to those skilled in the art, or alternatively, the high current density areas of the cathode must be shielded from the anode.

Surprisingly, it was found that, in electrodepositing insulating photosensitive polymers using the apparatus and methods of the present invention and using the aforementioned teachings, even thicker deposits were obtained at the edges of the surface. It was then unexpectedly found that by doing the opposite of what is taught by the art, i.e., by concentrating the anode opposite the high current density areas of the cathode, an essentially uniform deposit of insulating photosensitive composition was obtained.

The apparatus and methods of the present invention are particularly useful for electrodeposition of insulating materials wherein the anode/cathode separation are less than a given minimum distance. This distance can vary from system to system. For example, in a small five gallon laboratory coating apparatus, the minimum distance was found to be about four inches. In U.S. Pat. No. 4,592,816, Example 2, it is reported that an even deposition of an insulating photosensitive polymer composition was obtained using electrodes spaced about one inch apart. On its face, this result appears to be contrary to the teachings of the present invention However, the volume of the tank used is not reported by these workers. It has been discovered in the practice of the present invention that as the volume of the plating bath is increased, the unevenness of the deposit increases. With a ten gallon plating tank, dramatic unevenness problems are observed. This problem becomes even more apparent with a fifty gallon plating tank. Thus, it is likely that the volume of the plating bath used in U.S. Pat. No. 4,592,816 was less than the volume at which the unevenness problems become evident, with thickness variations of about ±10 percent across the surface to be coated.

In the embodiment shown in FIG. 1, a pair of spaced, parallel anodes 10 are disposed vertically in an electrodeposition bath 40 and are positioned relative to the cathode 30, also disposed vertically in the bath 40 to sandwich the cathode. The electrodes 10 and 30 are supplied with a suitable means (not shown) for applying a voltage therebetween.

The positions of the anodes 10 within the bath 40 relative to the cathode 30 are adjustable by any suitable means. The dimensions of the anodes 10, and the distance of the anodes 10 from the cathode 30 can be varied depending upon the composition of the material to be electrodeposited 50 and the desired thickness of the deposit.

Figure 2:
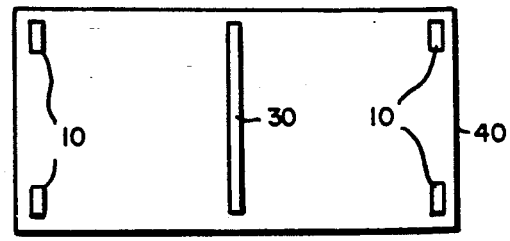
FIG. 2 comprises a top view of the apparatus depicted in FIG. 1.
Figure 3:
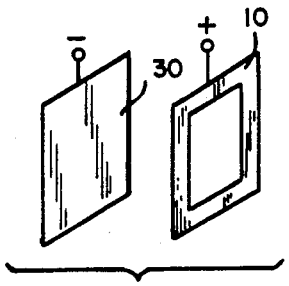
FIG. 3 comprises an isometric view of the electrodes from FIGS. 1 and 2.

FIG. 2 shows a top view of the apparatus depicted in FIG. 1. The electrodes 10 and 30 are illustrated in FIG. 3. The anode 10 is shaped like a picture frame having a square or rectangular opening in the center. The cathode 30 is a solid square or rectangle having about the same dimensions as the outer dimensions of the anode 10. In an alternative embodiment, both the anode 10 and the cathode 30 are solid squares or rectangles of about the same dimensions, wherein that portion of the anode opposite the low current density area of the cathode 20 is coated with a dielectric material such as a plastic, to shield the low current density areas of the cathode from the anode, i.e., to concentrate the anode opposite the high current density areas of the cathode.

Anodes for use in the apparatus and methods of the present invention are configured so that the anode is concentrated opposite the high current density areas of the cathode. In other words, the amount of current flowing to the high and low current density areas of the cathode is controlled in part by how the anode is configured. The embodiment shown in FIGS. 1, 2 and 3 is suitable for electrodeposition of an insulating material upon a flat surface. Other anode configurations which accomplish the desired control of current flow will be apparent to those skilled in the art.

The dimensions, number and position of anodes for use in the practice of the present invention will also depend upon considerations such as the shape of article to be coated and the composition of the material to be deposited.

Stainless steel has been found to be a useful material for anodes for use in the present invention. Other conventional materials used by those skilled in the art of electrophoresis are applicable.

Any conductive substrate which is desired to be coated may be used as the cathode in practicing the present invention. Substrates useful in the formation of circuit boards which may be coated by the practice of the present invention include copper clad laminate. Multiple cathodes may be used if desired.

The apparatus and methods of the present invention are also suitable for deposition of an anaphoretic photosensitive polymer composition, wherein the article to be coated is used as the anode and an inert material, e.g., is used as the cathode.

One advantage offered by the present invention are economies of scale in the electrodeposition process. By using the apparatus and methods of the present invention, plating baths of small yet of a commercially practical size are possible.

The insulating photosensitive polymer compositions disclosed in U.S. Pat. No. 4,592,816 may be used in the practice of the present invention. For example, a methylmethacrylate-based terpolymer was prepared and used to coat copper clad laminate.

Figure 4:
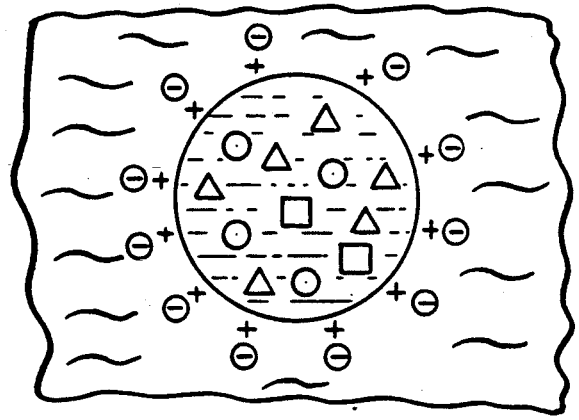
FIG. 4 comprises a micelle suitable for electrophoretic deposition in accordance with the invention.

The preparation involved the use of emulsion technology wherein a carrier polymer is made partially water soluble during the emulsification process by ionizing certain salt groups, but becomes insoluble during the plating process. Prior to emulsification, the various components that make up a photoresist (monomers, photoinitiators, dyes, etc.) were added to the carrier polymer and upon emulsification the polymer envelops these components and becomes a micelle. There are thousands of micelles per cubic centimeter of emulsion and each micelle has all the facets that make it a droplet of photoresist (See FIG. 4).

Figure 5:
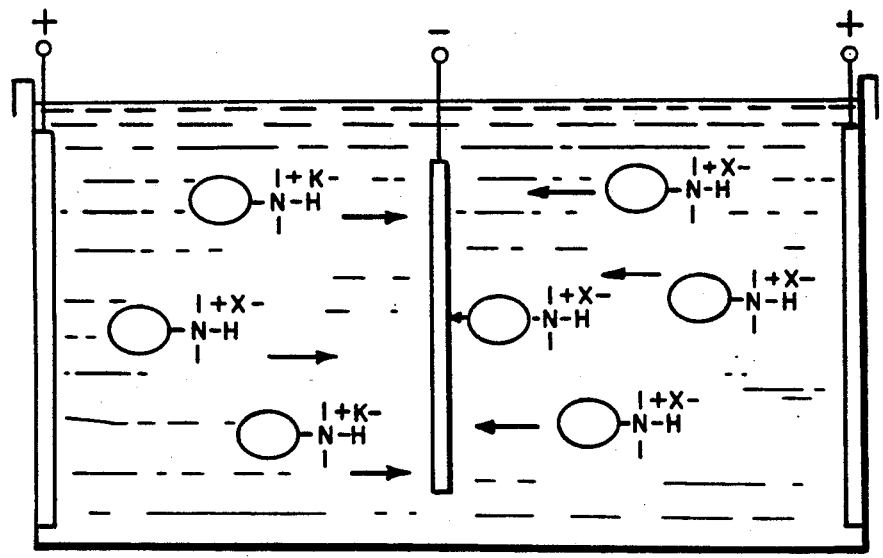
FIG. 5 comprises an electrophoretic apparatus suitable for electrodeposition of photoresists in the manufacture of printed circuit boards.

The positively charged emulsion is placed in a tank in which is suspended a stainless steel anode and a piece of copper clad laminate which is used as a cathode (See FIG. 5). A potential of less than 10 ASF is applied and a uniform coating of photoresist is deposited on the cathode. The mechanism of deposition is controlled by both electrochemical and chemical reactions. As a potential is applied, the positively charged micelles begin a migration towards the negatively charged cathode. The critical cathodic reaction is first the hydrolysis of water generating both hydrogen gas and hydroxyl ions:

$$2H_2O + 2e^- \rightarrow H_2 + 2OH^-.$$

This is followed instantaneously by the deprotonation of the salt groups on the micelle by the hydroxyl ions which makes the carrier polymer insoluble and causes it to deposit on the metal object:

$$(CARRIER\ POLYMER)^+ + OH^- \rightarrow CARRIER\ POLYMER + H_2O$$

Figure 6:
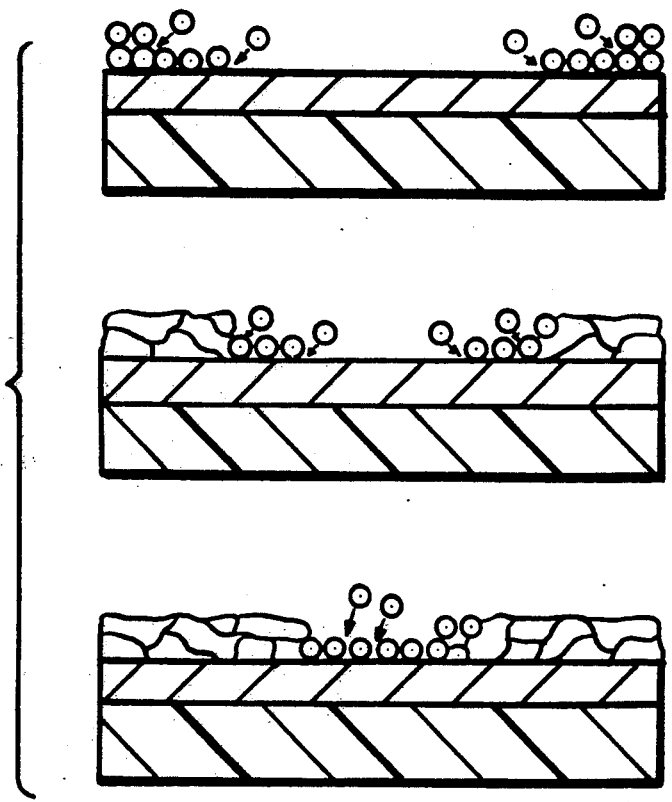
FIG. 6 depicts the growth of an electrodeposited coating.

The final thickness of the deposit is controlled by the formulation of the electrodeposition bath and also by the fact that as the micelles deposit, they immediately begin to grow into one another in a process known as coalescence and seal off any further attraction of charged photoresist. The plating process begins in the high current density areas of the cathode, and as these are sealed off, the process then moves its way towards the center of the cathode (See FIG. 6).

Figure 7:
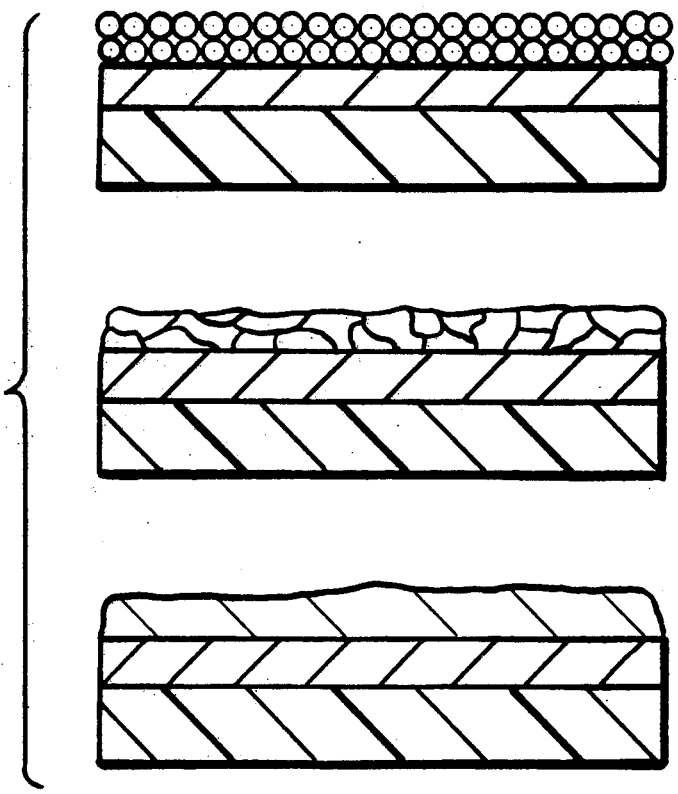
FIG. 7 depicts the growth of an electrodeposited coating in three distinct stages.

After deposition, the coated article is then rinsed in water and gently heated to 90° C. for 60 seconds. The heating process, called leveling, is designed to remove any residual water from the film and allow the organic deposit to form a flat continuous film. In review, the electrodeposition process has three phases: 1) deposition, 2) coalescence and 3) leveling (See FIG. 7).

The present invention will be further understood with reference to the following examples, which are purely exemplary in nature, and are not meant to be utilized to limit the scope of the invention:

EXAMPLE 1 Preparation of Photosensitive Polymer Composition.

The electrophoretic depositing composition used had a composition as follows:

| | |
|---|---|
| Polymer | 5.28 kilos |
| Dimethylamino ethyl methacrylate (8 parts) | |
| Methyl methacrylate (68 parts) | |
| Butyl acrylate (23 parts) | |
| Vinyl acetate (1 part) | |
| Trimethylolpropane triacrylate | 1.84 kilos |
| Dye | 0.064 kilos |
| Acetone | 0.48 kilos |
| Photoinitiator | 0.16 kilos |
| Lactic acid (20%) | 0.96 kilos |
| Distilled water | to 40.0 kilos |

EXAMPLE 2 Construction of Electrodes

Two 15"×12" stainless steel picture frame shaped anodes were fabricated by attaching a 13"×10" sheet of 0.015" thick epoxy glass dielectric to the center of the anode exposing a 2" band of the underlying stainless steel. These two anodes were fastened to the plating cell at a distance of 4 inches apart with the dielectric material facing inward. The anodes were then connected to the positive lead of a 60 volt DC rectifier.

EXAMPLE 3 Electrophoretic Deposition

A portion of the solution from Example 1 was placed in a 40 liter plating cell containing the two anodes described in Example 2. A 15"×12" piece of copper clad laminate used in the production of printed circuit boards was immersed into the plating cell between the anodes and fastened at a distance equidistant from the two anodes—approximately 2" from each anode. The copper clad laminate was then made the cathode by attaching it to the negative lead of a 60 volt DC rectifier. The solution was heated to 30° C. by the use of an external heat exchanger. After the desired temperature was reached, the part was energized with 50 volts of power for 5 seconds.. The resulting thickness of the deposit was measured as 0.0002"±0.00002" (5 microns ±0.5 microns with a beta backscatter device.

It is understood that the examples and embodiments described herein are for illustrative purposes only and that various modifications or changes in light thereof that will be suggested to persons skilled in the art are to be included in the spirit and purview of this application and the scope of the approved claims.

We claim:

1. An apparatus for electrodepositing an organic insulating composition on a conductive substrate from an electrodeposition bath wherein the substrate comprises one of the electrodes, the apparatus comprising:
   a. one or more cathodes disposed in the bath;
   b. one or more anodes disposed in the bath positioned to face the cathode; and
   c. means for applying a voltage between the anode and the cathode to produce a current whereby a current density gradient is formed on the cathode, the gradient comprising high and low current density areas, and wherein the anode is concentrated opposite the high current density areas of the cathode, thereby controlling the thickness of deposition by controlling the amount of current flowing to the cathode.

2. The apparatus of claim 1 wherein the substrate is the cathode.

3. An apparatus in accordance with claim 2, wherein the anode is concentrated opposite the high current density areas of the cathode by providing a means for shielding the low current density areas of the cathode from the anode.

4. An apparatus in accordance with claim 2, wherein the anode is concentrated opposite the high current density areas of the cathode by means of the configuration of the anode.

5. The apparatus of claim 2, wherein the distance between the anode and the cathode does not exceed four inches.

6. The apparatus of claim 2 where the cathode is square or rectangular and the anode is of the same shape and of about the same dimensions as the cathode with the center portion of the anode having a square or rectangular opening.

7. The apparatus of claim 2, wherein the cathode is square or rectangular and the anode is a square or rectangle of substantially the same size, wherein an inner square or rectangular area of the anode is substantially nonconductive.

8. The apparatus of claim 2, wherein (i) the anode is configured like a picture frame, and (ii) the cathode has about the same outer dimensions as the anode.

9. The apparatus of claim 2, wherein the cathode comprises copper clad laminate.

10. The apparatus of claim 2, wherein the composition which becomes insulating upon deposition comprises a photosensitive polymer composition.

11. A method of electrodepositing an organic insulating composition on a conductive substrate from an electrodeposition bath, said method comprising:
    a. providing an electrodeposition bath comprising an insulating composition;
    b. using the conductive substrate as a cathode disposed in the bath;
    c. providing one or more anodes disposed in the bath positioned to face the cathode; and
    d. applying a voltage between the cathode and the anodes to produce a current whereby a current density gradient is formed on the cathode, the gradient comprising high and low current density areas, and wherein the anode is concentrated opposite the high current density areas of the cathode.

12. The method of claim 11, wherein the anode is concentrated opposite the high current density areas of the cathode by providing a means for shielding the low current density areas of the cathode from the anode.

13. The method of claim 11, wherein the distance between the anode and the cathode does not exceed about 4 inches.

14. The method of claims 11, wherein the voltage is from about two to about one hundred and fifty volts.

* * * * *